United States Patent
Staengler (10) Patent No.: US 9,575,860 B2
(45) Date of Patent: Feb. 21, 2017

(54) APPARATUS AND A METHOD FOR MEMORY TESTING BY A PROGRAMMABLE CIRCUIT IN A SAFETY CRITICAL SYSTEM

(71) Applicant: Ferenc Staengler, Hyvinkaa (FI)

(72) Inventor: Ferenc Staengler, Hyvinkaa (FI)

(73) Assignee: Kone Corporation, Helsinki (FO)

( * ) Notice: Subject to any disclaimer, the term of this patent is extended or adjusted under 35 U.S.C. 154(b) by 221 days.

(21) Appl. No.: 14/082,655

(22) Filed: Nov. 18, 2013

(65) Prior Publication Data

US 2014/0164834 A1    Jun. 12, 2014

(30) Foreign Application Priority Data

Dec. 3, 2012    (EP) .................................... 12195266

(51) Int. Cl.
*G06F 11/00* (2006.01)
*G06F 11/27* (2006.01)
*G11C 29/08* (2006.01)

(52) U.S. Cl.
CPC .............. *G06F 11/27* (2013.01); *G11C 29/08* (2013.01)

(58) Field of Classification Search
CPC ......... G11C 29/08; G11C 29/10; G11C 29/12; G06F 11/27
See application file for complete search history.

(56) References Cited

U.S. PATENT DOCUMENTS

| | | | |
|---|---|---|---|
| 5,495,491 A * | 2/1996 | Snowden et al. | 714/764 |
| 6,014,336 A * | 1/2000 | Powell et al. | 365/201 |
| 6,243,840 B1 * | 6/2001 | Raad et al. | 714/719 |
| 7,353,914 B2 * | 4/2008 | Deplazes | 187/313 |
| 8,112,682 B2 * | 2/2012 | Lasser et al. | 714/718 |
| 8,352,817 B2 * | 1/2013 | Mattern et al. | 714/732 |
| 9,037,812 B2 * | 5/2015 | Chew | 711/154 |
| 9,037,928 B2 * | 5/2015 | Kleveland et al. | 714/710 |
| 2005/0028039 A1 | 2/2005 | Henderson et al. | |
| 2006/0129899 A1 | 6/2006 | Cochran et al. | |
| 2007/0294588 A1 | 12/2007 | Coulson | |
| 2008/0178177 A1 | 7/2008 | Archer et al. | |

OTHER PUBLICATIONS

European Search Report for EP 12195266.7 dated May 15, 2013.

* cited by examiner

*Primary Examiner* — Michael Maskulinski
(74) *Attorney, Agent, or Firm* — Harness, Dickey & Pierce, P.L.C.

(57) ABSTRACT

The invention relates to a method and apparatus. In the method, a programmable random access memory testing circuit detects a signal to initiate testing of at least one random access memory circuit, the testing circuit being connected to a bus to which a processor and the at least one memory circuit is connected, the at least one memory circuit comprising at least a first memory block. The testing circuit determines that the bus is not reserved and reserves the bus. The testing circuit reads application data in a first memory block to a temporary memory of the testing circuit. The testing circuit executes marching test for the first memory block in a memory circuit. The testing circuit returns the application data back to the first memory block in the memory circuit. The testing circuit releases the bus.

17 Claims, 3 Drawing Sheets

APPARATUS AND A METHOD FOR MEMORY TESTING BY A PROGRAMMABLE CIRCUIT IN A SAFETY CRITICAL SYSTEM

This application claims priority to European Patent Application No. EP12195266.7, filed Dec. 3, 2012, the entire contents of which are incorporated herein by reference.

BACKGROUND OF THE INVENTION

Field of the Invention

The invention relates to safety critical apparatuses, random access memory testing, and a circuit for random access memory testing in a safety critical system.

Description of the Related Art

In safety critical systems the correct and failure free operation of all system components is essential. Examples of such safety critical system include aircraft flight control systems, heart pacemakers and elevator safety systems. Elevator safety system control safety aspect of elevators such as elevator operation in various fault situations. It must be necessary to be able to apply elevator brakes, to receive and to transmit distress signals, check for overload, check for the going off of fire alarms and ensure the opening of the doors whenever the opening is safe for passengers. The elevator safety system may be separate from other non-critical systems such as entertainment, commercials, infotainment or elevator driving functions, for example, the serving of elevator cage calls from floors. The safety systems and call servicing systems in elevators may run on physically separate hardware platforms. The elevator safety systems gather typically a lot of sensor information relating to elevator load, movement, signals from users, signals from safety contacts, such as shaft door safety contacts, and the status of various other system components. This implies that elevator safety systems must have a limited response time for signals received and transmitted between a central processing unit, sensors, safety contacts, control relays and control circuits, which may be further connected to elevator drive motor and door controller circuits.

Safety critical systems are tested and functionally verified extensively. The correct operation of a safety critical system must be verified component by component. Examples of such components are central processing units, memories, message busses and various peripherals connected to the message bus. There are certain security standards that govern the safety critical systems in elevators. Examples of such include Programmable Electronic System in Safety Related Applications (PESSRAL). The International Standards Organization (ISO) standard 22201:2009 is applicable to passenger lifts, goods/passenger lifts used in residential buildings, offices, hospitals, hotels, industrial plants, etc. ISO 22201:2009 covers those aspects that it is necessary to address when programmable electronic systems are used to carry out electric safety functions for lifts (PESSRAL).

An important aspect in safety critical elevator systems is the correct functioning of memory. Memory cells may be stuck to a certain value, they may not transition to an another value, or the address decoder than selects memory cells rows or columns for access based on address lines driven may be faulty entirely or just for certain address ranges. Memory cells may also leak to neighboring memory cells. Memory faults may cause subtle erroneous behavior to once well-working applications of the safety critical system or they may cause total system freezing.

In standard personal computers Random Access Memory (RAM) is often tested at computer power on or reboot. However, this may not be sufficient for safety critical elevator systems. Firstly, safety critical elevator systems remain powered on for extended periods of time and are not rebooted or powered on or off frequently. Secondly, the memory must in any case also be tested while the safety critical system is operational. Therefore, there arises the need to test the memory of the safety critical system while the safety critical system software is executing. It may not be possible to suspend the execution of the system software by the system processor in order to perform a complete memory test. A piecemeal approach for testing the memory in portions by the system processor also involves many problems. While the memory is being tested by the processor it must be ensured that the memory testing does not accidentally cause writes to the memory area being tested. This requires considerable care of the programmer to avoid using machine code instructions that write to the RAM. It may also be necessary to check the machine code generated by a high-level programming language compiler. When the processor is used for memory testing software and hardware interrupts must be disabled, which causes disturbance. The interrupts may not be processed fast enough which introduces latency to the safety critical system. The memory testing by the processor turns of normal process or thread scheduling, which may cause nondeterministic behavior for the safety critical system. For example, the system might react too slowly for critical signals, monitor critical sensors too slowly, or perform critical computations too slowly or too late. Peripherals communicating with the processor in the safety critical system must always have a certain speed of operation available. Generally, it is very risky to intrude the functioning of the processor by way of the RAM tests run by the processor.

The use of the processor for RAM testing also involves a further problem. Always when the safety critical system involving the memory testing program code is changed, the whole safety critical system must be tested and its functioning must be verified with an extensive gamut of tests. The burden to make changes becomes very high for the programmer. The safety critical system must also be re-tested if the software development tools are changed, for example, when a new compiler version is introduced.

Therefore, it would be beneficial to be able to implement the memory testing as a separate entity the correct functioning of which could be verified separately.

SUMMARY OF THE INVENTION

According to an aspect of the invention, the invention is a method, comprising: receiving, by a random access memory testing circuit, a signal to initiate testing of at least one random access memory circuit, the testing circuit being connected to a bus to which a processor and the at least one random access memory circuit is connected, the at least one random access memory circuit comprising at least a first memory block; determining that the bus is not reserved; reserving the bus by the testing circuit; reading first application data comprised in the first memory block to the testing circuit via the bus; storing the first application data to a temporary memory associated with the testing circuit; writing, by the testing circuit, at least one first data pattern to the first memory block via the bus; reading, by the testing circuit, at least one second data pattern from the first memory block via the bus; comparing, by the testing circuit, the at least one first data pattern to the at least one second data pattern to verify the correct functioning of a first random access memory circuit storing the first memory block, the first random access memory circuit being among the at least one random access memory circuit; writing the first application data back to the first memory block via the bus in case the first random access memory circuit functions correctly; and releasing the bus by the testing circuit.

According to a further aspect of the invention, the invention is an apparatus comprising: a bus; at least one random access memory circuit connected to the bus, the at least one random access memory circuit comprising at least a first memory block; a processor connected to the bus; and a random access memory testing circuit connected to the bus, the testing circuit comprising a temporary memory, the testing circuit being configured to receive a signal to initiate testing of the at least one random access memory circuit, to determine that the bus is not reserved, to reserve the bus by the testing circuit, to read first application data comprised in the first memory block to the testing circuit via the bus, to store the first application data to a temporary memory associated with the testing circuit, to write at least one first data pattern to the first memory block via the bus, to read at least one second data pattern from the first memory block via the bus, to compare the at least one first data pattern to the at least one second data pattern to verify the correct functioning of a first random access memory circuit storing the first memory block, the first random access memory circuit being among the at least one random access memory circuit, to write the first application data back to the first memory block via the bus in case the first random access memory circuit functions correctly, and to release the bus by the testing circuit.

According to a further aspect of the invention, the invention is an elevator safety system comprising the apparatus.

According to a further aspect of the invention, the invention is an apparatus comprising: means for receiving, by a random access memory testing circuit, a signal to initiate testing of at least one random access memory circuit, the testing circuit being connected to a bus to which a processor and the at least one random access memory circuit is connected, the at least one random access memory circuit comprising at least a first memory block and; means for determining that the bus is not reserved; reserving the bus by the testing circuit; reading first application data comprised in the first memory block to the testing circuit via the bus; means for storing the first application data to a temporary memory associated with the testing circuit; means for writing, by the testing circuit, at least one first data pattern to the first memory block via the bus; means for reading, by the testing circuit, at least one second data pattern from the first memory block via the bus; means for comparing, by the testing circuit, the at least one first data pattern to the at least one second data pattern to verify the correct functioning of a first random access memory circuit storing the first memory block, the first random access memory circuit being among the at least one random access memory circuit; means for writing the first application data back to the first memory block via the bus in case the first random access memory circuit functions correctly; and means for releasing the bus by the testing circuit.

According to a further aspect of the invention, the invention is an elevator safety system comprising the apparatus.

According to a further aspect of the invention, the invention is a computer program comprising code adapted to cause the following when executed on a data-processing system: receiving, by a random access memory testing circuit, a signal to initiate testing of at least one random access memory circuit, the testing circuit being connected to a bus to which a processor and the at least one random access memory circuit is connected, the at least one random access memory circuit comprising at least a first memory block and; determining that the bus is not reserved; reserving the bus by the testing circuit; reading first application data comprised in the first memory block to the testing circuit via the bus; storing the first application data to a temporary memory associated with the testing circuit; writing, by the testing circuit, at least one first data pattern to the first memory block via the bus; reading, by the testing circuit, at least one second data pattern from the first memory block via the bus; comparing, by the testing circuit, the at least one first data pattern to the at least one second data pattern to verify the correct functioning of a first random access memory circuit storing the first memory block, the first random access memory circuit being among the at least one random access memory circuit; writing the first application data back to the first memory block via the bus in case the first random access memory circuit functions correctly; and releasing the bus by the testing circuit.

According to a further aspect of the invention, the invention is a computer program product comprising the computer program.

According to a further aspect of the invention, the invention is a method. In the method, a programmable random access memory testing circuit detects a signal to initiate testing of at least one random access memory circuit, the testing circuit being connected to a bus to which a processor and the at least one random access memory circuit is connected, the at least one random access memory circuit comprising at least a first memory block and. The testing circuit determines that the bus is not reserved and reserves the bus. The testing circuit reads application data in a first memory block to a temporary memory of the testing circuit. The testing circuit executes marching test for the first memory block in a memory circuit among the at least one memory circuit. The testing circuit returns the application data back to the first memory block in the memory circuit. The testing circuit releases the bus. The testing circuit may again reserve the bus if the allocation of the bus is not necessary for other purposes than memory testing, that is, by the processor to convey non-memory test related data. Thereupon, the testing circuit may conduct a testing of a second memory block comprised in the at least one random access memory circuit. An apparatus may implement the method.

In one embodiment of the invention, the at least one random access memory circuit comprises a first random access memory circuit comprising the first memory block and a second random access memory circuit comprising the second memory block. In one embodiment of the invention, a memory block comprises an address range of, for example, bytes, words, doublewords or quad-words.

In one embodiment of the invention, the step of determining that the bus is not reserved comprises sensing at least one lead or pin to determine that the bus does not have a reservation state signal.

In one embodiment of the invention, the reading of data comprised in a memory block via the bus comprises obtaining to the testing circuit from a memory circuit comprising the memory block at least one data packet, the data packet comprising at least one byte, for example, four, eight or sixteen bytes.

In one embodiment of the invention, the writing of data to a memory block via the bus comprises obtaining to a memory circuit comprising the memory block from the testing circuit at least one data packet, the data packet comprising at least one byte, for example, four, eight or sixteen bytes.

In one embodiment of the invention, a memory block is a bus data packet.

In one embodiment of the invention, the method further comprises: reserving the bus for the testing circuit if the allocation of the bus is not necessary for other purposes than memory testing; and conducting a testing, by the testing circuit, of a second memory block comprised in the at least one random access memory circuit.

In one embodiment of the invention, the method further comprises: storing to at least one register in the testing circuit information on at least one memory block for which memory testing is to be performed.

In one embodiment of the invention, the information on the at least one memory block is an address range.

In one embodiment of the invention, the method further comprises: detecting a booting signal by the processor; and storing to the at least one register in the testing circuit information that the at least one random access memory circuit are to be tested completely.

In one embodiment of the invention, the method further comprises: storing to at least one register in the testing circuit information on a schedule for signaling the initiation of the testing of the at least one random access memory circuit.

In one embodiment of the invention, the method further comprises: storing a memory testing algorithm to a memory in association with the testing circuit.

In one embodiment of the invention, the step of reserving the bus by the testing circuit comprises: transmitting a reservation signal on the bus from the testing circuit.

In one embodiment of the invention, the step of reserving the bus by the testing circuit comprises: transmitting a reservation signal from the testing circuit to a bus arbiter circuit; and receiving an acknowledgement signal to the testing circuit.

In one embodiment of the invention, the step of reserving the bus by the testing circuit comprises: adding information about the reservation signal and a bus address of the testing circuit to a queue of the bus arbiter circuit.

In one embodiment of the invention, the first memory block comprises all aggressor memory cells and all victim memory cells, the aggressor memory cells being capable of changing the states of the victim memory cells.

In one embodiment of the invention, the first memory block comprises all addresses within a sub-unit of an address decoder of a random access memory circuit among the at least one random access memory circuit.

In one embodiment of the invention, at least one first data pattern comprises at least one of a checkerboard data pattern, a march test data pattern and a galloping pattern for galloping pattern test (GALPAT).

In one embodiment of the invention, the processor, the testing circuit, the bus and the at least one memory circuit are comprised in a chipset.

In one embodiment of the invention, the processor, the testing circuit and the bus are comprised in a single chip.

In one embodiment of the invention, the processor, the testing circuit, the bus and the at least one memory circuit are comprised in an elevator safety unit.

In one embodiment of the invention, the elevator safety unit controls at least one of an acceleration limit of an elevator cage, an elevator scale, an emergency break of the elevator, at least one elevator door and a distress signal communication link.

In one embodiment of the invention, the testing circuit may be configured to perform any of the aforementioned method steps, regarding any of the embodiments.

In one embodiment of the invention, a computer program comprising code or computer program product comprising code may comprise, or may be adapted to cause, any of the aforementioned method steps when executed on a data-processing system.

In one embodiment of the invention, the apparatus is a semiconductor circuit, a chip or a chipset.

In one embodiment of the invention, the computer program is stored on a computer readable medium. The computer readable medium may be, but is not limited to, a removable memory card, a removable memory module, a magnetic disk, an optical disk, a holographic memory or a magnetic tape. A removable memory module may be, for example, a USB memory stick, a PCMCIA card or a smart memory card.

The embodiments of the invention described hereinbefore may be used in any combination with each other. Several of the embodiments may be combined together to form a further embodiment of the invention. A method, a safety system, an apparatus, a computer program or a computer program product to which the invention is related may comprise at least one of the embodiments of the invention described hereinbefore.

It is to be understood that any of the above embodiments or modifications can be applied singly or in combination to the respective aspects to which they refer, unless they are explicitly stated as excluding alternatives.

The benefits of the invention are related to improved safety and reliability of safety critical control systems. The invention makes it possible to perform memory testing in a single entity that may be verified for correct operation separately. The memory testing entity may be tested and verified only once. It is no longer necessary to verify the correct operation of the entire safety critical system when only memory testing procedures are affected by changes. The memory testing may be made invisible for applications executed by the processor of the safety critical system that uses the memory tested by the single memory test entity. The memory testing by the single memory test entity is also cheaper to implement compared to solutions where the processor performs the memory testing by suspending other applications. The invention makes it possible to design programmable elevator safety devices, which may reach safety integration level SIL 2 or SIL 3, as required by elevator safety code EN 81-20.

BRIEF DESCRIPTION OF THE DRAWINGS

The accompanying drawings, which are included to provide a further understanding of the invention and constitute a part of this specification, illustrate embodiments of the invention and together with the description help to explain the principles of the invention. In the drawings.

DETAILED DESCRIPTION OF THE EMBODIMENTS

Reference will now be made in detail to the embodiments of the present invention, examples of which are illustrated in the accompanying drawings.

Figure 1:
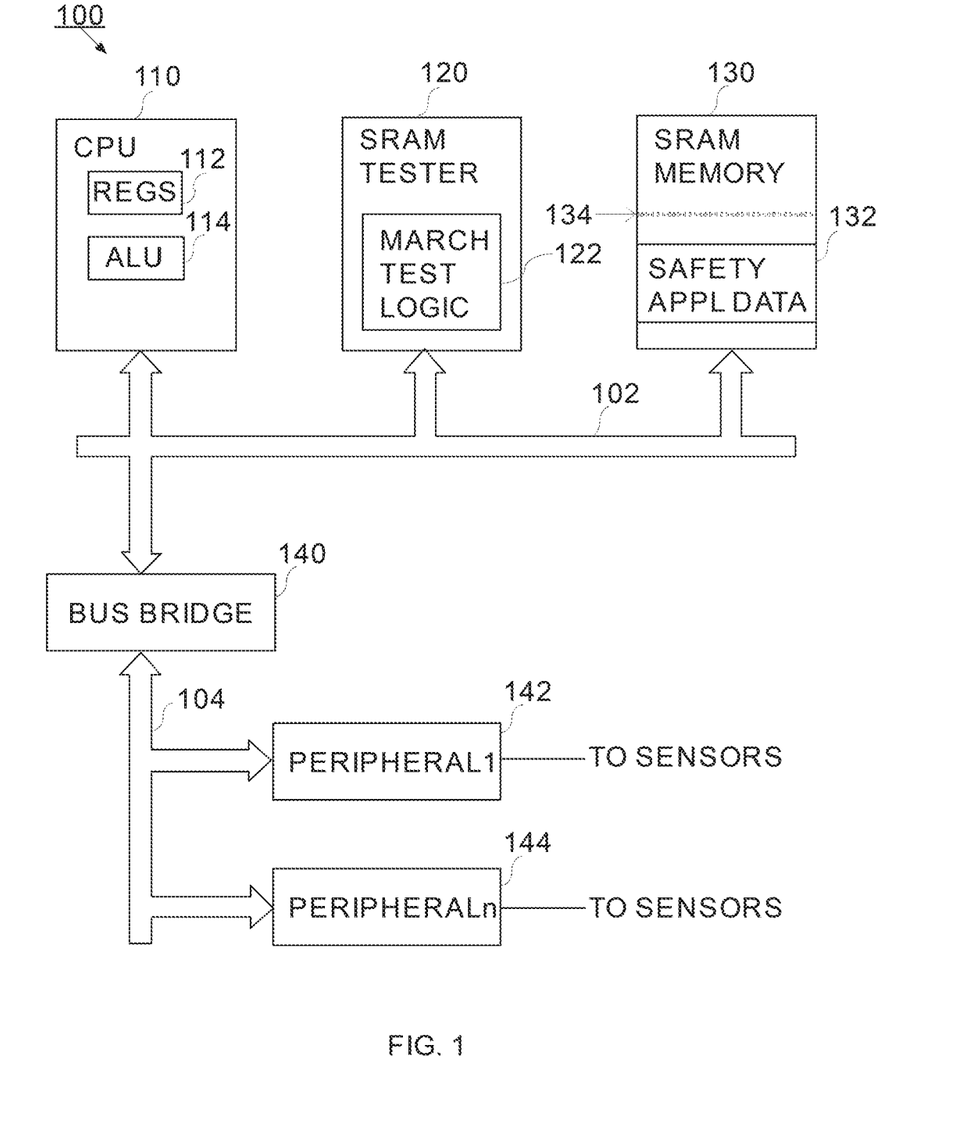
FIG. 1 is a block diagram illustrating a safety apparatus in one embodiment of the invention.

FIG. 1 is a block diagram illustrating a safety apparatus 100 in one embodiment of the invention. In one embodiment of the invention, the safety apparatus is associated with a safety system of an elevator. An elevator safety system may be separate from other non-critical systems of elevator that, for example, take care of driving elevator car according to elevator car calls from call-giving appliances. The elevator car may also be referred to as elevator cage.

The safety apparatus comprises a first bus 102, which is connected to a processor 110, a Static Random Access Memory (SRAM) 130, and a testing circuit 120 for SRAM testing. Bus 102 may also be connected to a bus bridge 140 for access to further peripheral devices. Bus 102 may also comprise a bus arbiter unit (not shown) from which access to bus for address and data transfer may be requested. The bus arbiter unit may comprise a request queue. Bus 102 may comprise, for example, 32 bit lines for conveying memory addresses and data associated with the memory addresses. Bus 102 may be connected to other processors so that in place of processor 110 may be a plurality of processors. Processor 110 may comprise multiple cores. Processor 110 may comprise at least one register 112 and an Arithmetic Logic Unit (ALU) 114. The at least one register 112 may be a register file. Processor 110 may also comprise an instruction decoder, a pipeline, an instruction execution unit and an instruction retirement unit. To bus bridge 140 may be connected a second bus 104 to which are connected at least peripheral devices 142 and 144 via which access to external sensors is provided. Sensors 142 and 144 may be, for example, elevator cage scales, elevator cage accelerometers, elevator safety contacts and elevator car positioning devices. SRAM 130 comprises memory area 132 which contains application data for at least one safety application run using safety apparatus 100. The safety application may, for example, monitor measurement data from sensors 142 and 144 and provide control commands for bringing the elevator into safety state, if an operational anomaly of the elevator is detected. This may include monitoring and limiting at least one of elevator car velocity and acceleration. SRAM 130 has an address 134 which indicates an address range within which safety critical applications store data. SRAM testing may be limited to addresses lower than address 134. SRAM 130 may have an address 134 which indicates an address range within which safety critical applications store data. SRAM testing may be limited to addresses lower than address 134.

Testing circuit 120 for SRAM testing comprises a programmable logic 122, which implements a testing for SRAM 130, for at least address range below address 134. Testing circuit 120 may be a programmable meta-block or a programmable meta-entity. Testing circuit 120 may also be a Field Programmable Gate Array (FPGA). Testing circuit 120 may also be a processor. Testing circuit 120 may clocked with same clock as processor 110. Programmable logic 122 may implement testing of SRAM 130 via a marching test. For example, in a marching test a memory area to be tested may first be written to contain all zeroes, then checked whether all addresses contain zeroes, then written to contain all ones and then checked whether all addresses contain ones. Testing circuit 120 may fetch a memory block from SRAM 130 store the existing contents of the memory block to a separate temporary memory, then perform the marching test within the memory block, fetch the existing contents from the separate temporary memory and write the existing contents back to the memory block. Testing circuit 120 may fetch memory blocks from SRAM 130 block-by-block and execute the marching test for each block separately. Processor 110 may have to wait, that is, be stalled only when a single memory block is being tested by testing circuit 120. In between the testing of memory blocks processor 110 may continue to execute safety applications that require access to SRAM 130. During the testing of a memory block testing circuit 120 may keep bus 102 reserved. A memory block may, for example, comprise 16 bytes, 512 bytes or 1024 bytes, depending on the delay restrictions for utility data transfer over bus 102 for safety applications. The temporary memory may be associated with testing circuit 120 or within testing circuit 120.

Figure 2:
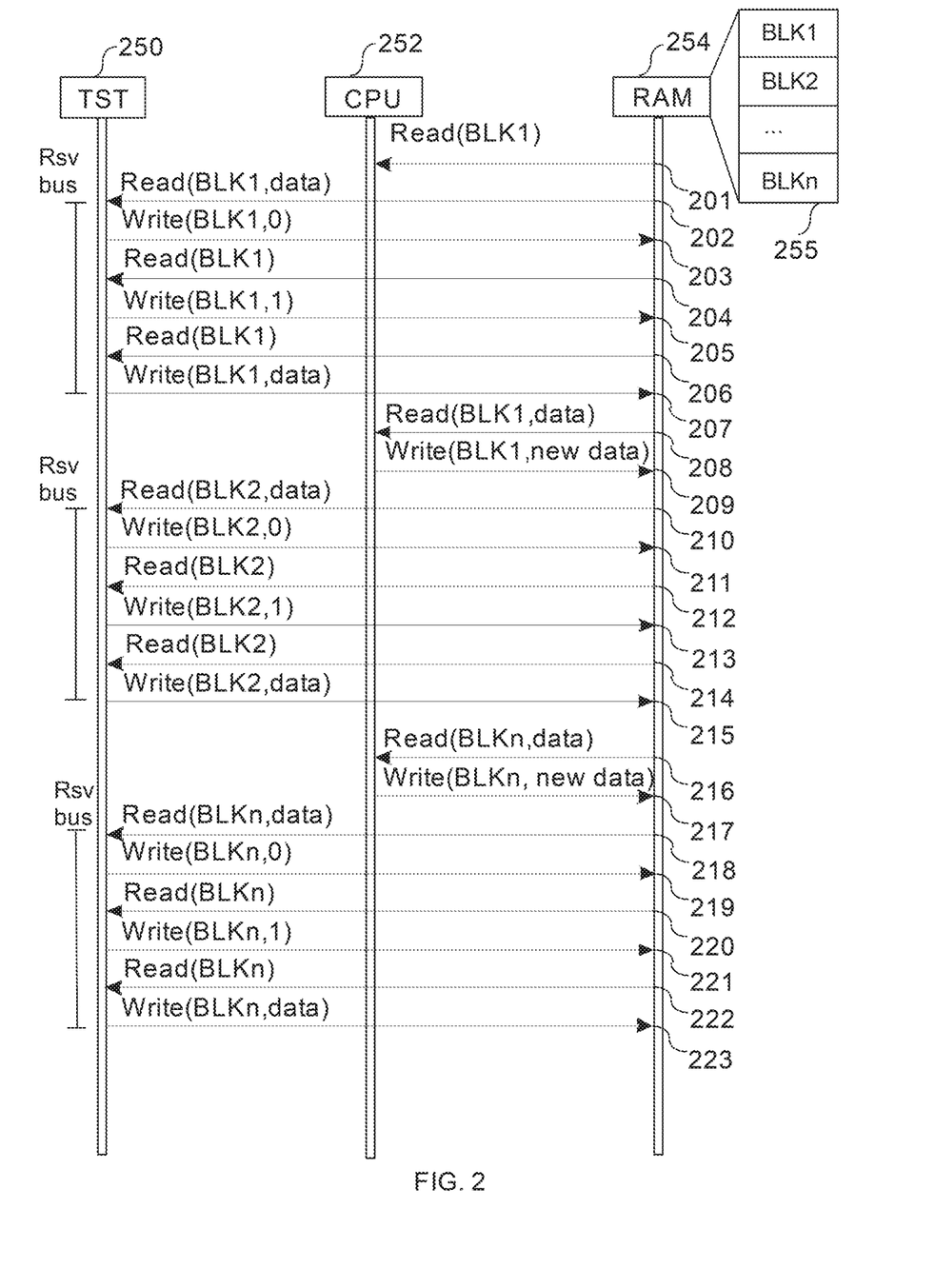
FIG. 2 is a message sequence chart that illustrates memory testing performed by a tester circuit while a processor executes at least one application using the memory being tested in one embodiment of the invention.

FIG. 2 is a message sequence chart that illustrates memory testing performed by a tester circuit while a processor executes at least one application using the memory being tested in one embodiment of the invention.

In FIG. 2 there is testing circuit 250, for example, a test block comprising programmable logic. There is also a Central Processing Unit (CPU) 252 and a Random Access Memory (RAM) 254, for example, a static RAM. RAM 254 is illustrated to comprise blocks BLK1, BKL2 and BLKn in the contents of RAM 254 illustrated with box 255. The suffix n indicates an arbitrary positive integer. The communication between testing circuit 250, CPU 252 and RAM 254 occurs via a bus (not shown for clarity purposes).

Initially, CPU 252 reads at least one byte within block BLK1 from RAM 254 to access application data, as illustrated with arrow 201. CPU 252 may first transmit at least one address via the bus to request the at least one byte of BLK1 from RAM 254. This is not shown for clarity purposes. After the reading of the at least one byte from block BLK1, the bus is no longer reserved.

Later, testing circuit 250 detects that a time cycle has elapsed for performing the testing of memory blocks BKL1, . . . , BLKn in RAM 254. Testing circuit may receive a bus clock signal which counts down a register at each clock cycle. When the register reaches zero, the testing is initiated by testing circuit 120.

Testing circuit 120 starts testing SRAM 254 from block BLK1. Testing circuit 120 reserves the bus and reads BLK1 from RAM 254 comprising existing data, as illustrated with arrow 202. The bus may be reserved by setting a lead associated with the bus to the value one or by transmitting a specific waveform on the lead. The reservation may be removed by resetting the lead, for example, to the value zero. Testing circuit 120 stores the existing data to a temporary memory storage (not shown) within the testing circuit 250. Testing circuit 120 fills block BLK1 with 0 valued bits to RAM 254, as illustrated with arrow 203. Testing circuit 120 checks that all bits in BLK1 are 0 within RAM 254, as illustrated with arrow 204. Thereupon, testing circuit 120 fills block BLK1 with one valued bits to RAM 254, as illustrated with arrow 205. Testing circuit 120 checks that all bits in BLK1 have value one within RAM 254, as illustrated with arrow 206. Finally, for block BLK1, testing circuit 250 obtains the existing data from the temporary memory storage and writes block BLK1 to RAM 254 via the bus, as illustrated with arrow 207. Testing circuit 250 may set the bus reservation lead to indicate that the bus is available.

At this stage the bus is free and CPU 252, while executing an application, may read BLK1 from RAM 254, modify the data in BLK1 to have new data in BLK1 written to RAM 254, as illustrated with arrows 208 and 209, respectively.

Thereupon, testing circuit 120 may reserve the bus again and testing circuit 120 may read existing data block BLK2 from RAM 254, as illustrated with arrow 210. This is followed by the marching test for block BLK2 where BLK2 is written with an all zero pattern, checked to store the all zero pattern, written with all one pattern and checked to store all one pattern, as illustrated with arrows 211-214. Finally, the existing data of block BLK2 is written by testing circuit 120 to RAM 254, as illustrated with arrow 215. After that testing circuit 120 may set the bus reservation lead to indicate that the bus is free.

Because the bus is free, CPU 252 read at least one byte of data from RAM 254 and writes the modified data to RAM 254, as illustrated with arrows 216 and 217.

Thereupon, testing circuit 120 may reserve the bus again for testing the final memory block BLKn. Testing circuit 120 may now read existing data block BLKn from RAM 254, as illustrated with arrow 218. This is followed by the marching test for block BLKn where BLKn is written with an all zero pattern, checked to store the all zero pattern, written with all one pattern and checked to store all one pattern, as illustrated with arrows 219-222. Finally, the existing data of block BLKn is written by testing circuit 120 to RAM 254, as illustrated with arrow 223. After that testing circuit 120 may set the bus reservation lead to indicate that the bus is free. Now the marching test for RAM 254 is complete.

The embodiments of the invention described hereinbefore in association with FIGS. 1 and 2 may be used in any combination with each other. Several of the embodiments may be combined together to form a further embodiment of the invention.

Figure 3:
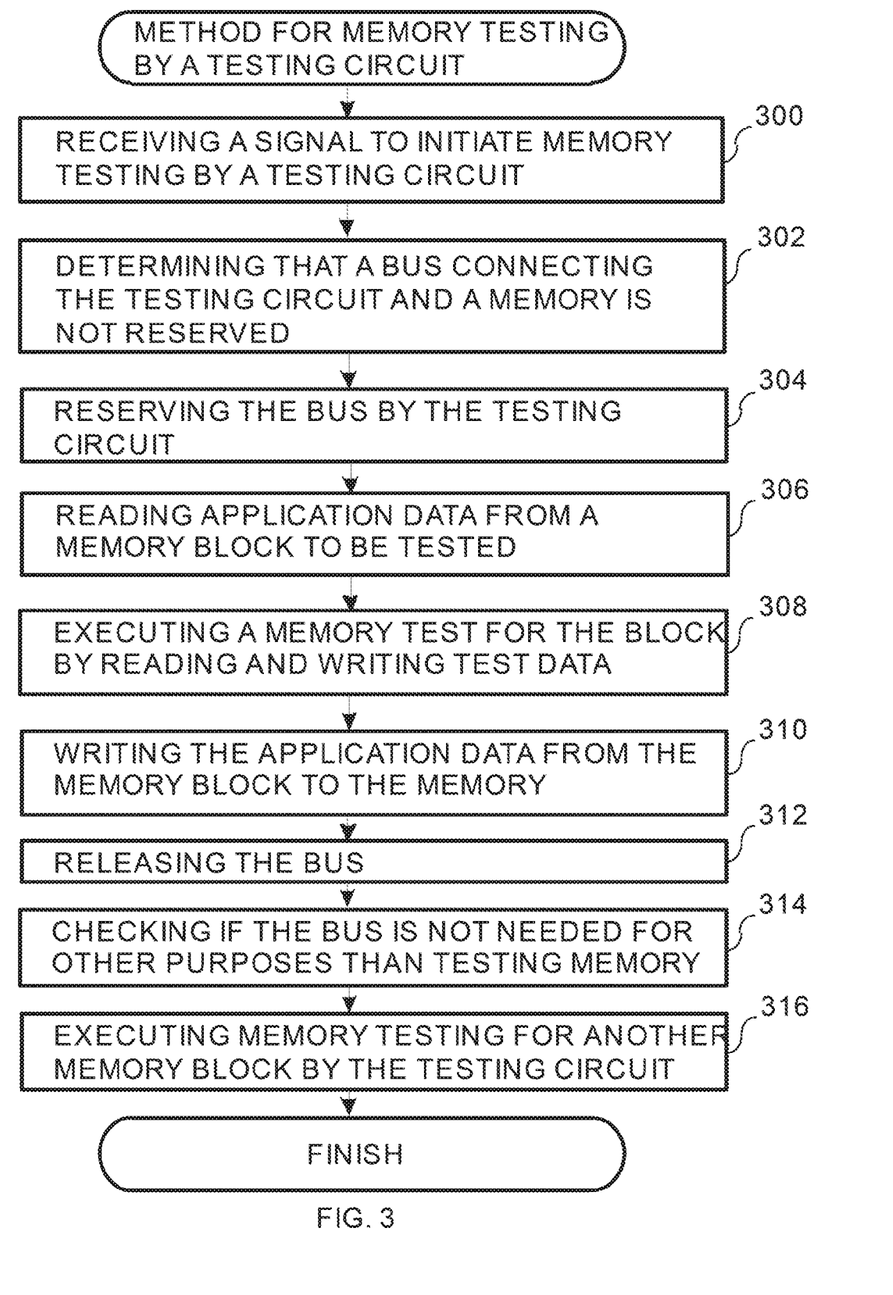
FIG. 3 is a flow chart illustrating a method for memory testing by a programmable circuit in one embodiment of the invention.

FIG. 3 is a flow chart illustrating a method for memory testing by a programmable circuit in one embodiment of the invention.

At step 300 a random access memory testing circuit detects a signal to initiate testing of at least one random access memory circuit, the testing circuit being connected to a bus to which a processor and the at least one memory circuit is connected, the at least one random access memory circuit comprising at least a first memory block. The random access memory testing circuit may be a programmable random access memory testing circuit. The testing circuit may also be referred to as testing logic.

At step 302 the testing circuit determines that the bus is not reserved.

At step 304 the testing circuit reserves the bus for memory marching test of a memory block, for example, by setting a specific lead on the bus to a first predefined waveform. The first predefined waveform may represent a constant or a Direct Current (DC) bit value such as one.

In one embodiment of the invention, the bus may be reserved for the time required to test a memory block and the block size is determined to fit into a maximum bus reservation time. The maximum bus reservation time may be determined based on at least one delay limit for responding to a signal in the processor, the signal being from a peripheral device communicatively connected to the processor via the bus.

At step 306 the testing circuit reads a first application data comprised in the first memory block to the testing circuit via the bus and stores the first application data to a temporary memory associated with the testing circuit.

At step 308 the testing circuit executes a memory test for the block by writing and reading a test pattern to the block in the at least one random access memory circuit. This may comprise writing, by the testing circuit, at least one memory test data pattern to the first memory block via the bus and, thereupon, reading, by the testing circuit, the at least one memory test data pattern from the first memory block via the bus, and comparing the written and read test data pattern.

At step 310 the testing circuit writes the first application data back to the first memory block via the bus. If the test at previous step is not successful, an alert may be provided to the at least one processor. This may cause the bringing the elevator to a safe state. There may be no attempt to write the first application data back to the first memory block, if the test is not successful.

At step 312 the testing circuit releases the bus, for example, by setting a specific lead on the bus to a second predefined waveform. The first predefined waveform may represent a constant or a Direct Current (DC) bit value such as zero.

In one embodiment of the invention, at step 314 the testing circuit reserves the bus for the testing circuit, if the allocation of the bus is not necessary for other purposes than memory testing, for example, the processor keeps the bus available due to lack of need to transport utility data over the bus.

In one embodiment of the invention, at step 316 the testing circuit conducts a testing of a second memory block comprised in the at least one random access memory circuit. The second memory block is different from the first memory block.

In one embodiment, steps 314 and 316 disclosed in FIG. 3 are optional steps and only steps 300-312 are executed.

The embodiments of the invention described hereinbefore in association with FIGS. 1, 2 and 3 may be used in any combination with each other. Several of the embodiments may be combined together to form a further embodiment of the invention.

As used in this application, the term 'circuitry' and 'circuit' refers to all of the following: (a) hardware-only circuit implementations (such as implementations in only analog and/or digital circuitry) and (b) to combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions) and (c) to circuits, such as a microprocessor(s) or a portion of a microprocessor(s), that require software or firmware for operation, even if the software or firmware is not physically present. This definition of 'circuitry' applies to all uses of this term in this application, including in any claims. As a further example, as used in this application, the term "circuitry" would also cover an implementation of merely a processor (or multiple processors) or portion of a processor and its (or their) accompanying software and/or firmware. The term "circuitry" would also cover, for example and if applicable to the particular claim element, a baseband integrated circuit or applications processor integrated circuit for a mobile phone or a similar integrated circuit in server, a cellular network device, or other network device The exemplary embodiments of the invention can be included within any suitable device, for example, including any suitable servers, workstations, PCs, laptop computers, PDAs, Internet appliances, handheld devices, cellular telephones, wireless devices, other devices, and the like, capable of performing the processes of the exemplary embodiments, and which can communicate via one or more interface mechanisms, including, for example, Internet access, telecommunications in any suitable form (for instance, voice, modem, and the like), wireless communications media, one or more wireless communications networks, cellular communications networks, 3G communications networks, 4G communications networks, Public Switched Telephone Network (PSTNs), Packet Data Networks (PDNs), the Internet, intranets, a combination thereof, and the like.

It is to be understood that the exemplary embodiments are for exemplary purposes, as many variations of the specific hardware used to implement the exemplary embodiments are possible, as will be appreciated by those skilled in the hardware art(s). For example, the functionality of one or more of the components of the exemplary embodiments can be implemented via one or more hardware devices, or one or more software entities such as modules.

The exemplary embodiments can store information relating to various processes described herein. This information can be stored in one or more memories, such as a hard disk, optical disk, magneto-optical disk, RAM, and the like. One or more databases can store the information regarding cyclic prefixes used and the delay spreads measured. The databases can be organized using data structures (e.g., records, tables, arrays, fields, graphs, trees, lists, and the like) included in one or more memories or storage devices listed herein. The processes described with respect to the exemplary embodiments can include appropriate data structures for storing data collected and/or generated by the processes of the devices and subsystems of the exemplary embodiments in one or more databases.

All or a portion of the exemplary embodiments can be implemented by the preparation of one or more application-specific integrated circuits or by interconnecting an appropriate network of conventional component circuits, as will be appreciated by those skilled in the electrical art(s).

As stated above, the components of the exemplary embodiments can include computer readable medium or memories according to the teachings of the present inventions and for holding data structures, tables, records, and/or other data described herein. Computer readable medium can include any suitable medium that participates in providing instructions to a processor for execution. Such a medium can take many forms, including but not limited to, non-volatile media, volatile media, transmission media, and the like. Non-volatile media can include, for example, optical or magnetic disks, magneto-optical disks, and the like. Volatile media can include dynamic memories, and the like. Transmission media can include coaxial cables, copper wire, fiber optics, and the like. Transmission media also can take the form of acoustic, optical, electromagnetic waves, and the like, such as those generated during radio frequency (RF) communications, infrared (IR) data communications, and the like. Common forms of computer-readable media can include, for example, a floppy disk, a flexible disk, hard disk, magnetic tape, any other suitable magnetic medium, a CD-ROM, CDRW, DVD, any other suitable optical medium, punch cards, paper tape, optical mark sheets, any other suitable physical medium with patterns of holes or other optically recognizable indicia, a RAM, a static RAM, a PROM, an EPROM, a FLASH-EPROM, any other suitable memory chip or cartridge, a carrier wave or any other suitable medium from which a computer can read.

While the present inventions have been described in connection with a number of exemplary embodiments, and implementations, the present inventions are not so limited, but rather cover various modifications, and equivalent arrangements, which fall within the purview of prospective claims.

The embodiments of the invention described hereinbefore in association with the figures presented and the summary of the invention may be used in any combination with each other. Several of the embodiments may be combined together to form a further embodiment of the invention.

It is obvious to a person skilled in the art that with the advancement of technology, the basic idea of the invention may be implemented in various ways. The invention and its embodiments are thus not limited to the examples described above; instead they may vary within the scope of the claims.

The invention claimed is:

1. A method for testing functionality of memory blocks of at least one random access memory (RAM) circuit, comprising:
    receiving, by a testing circuit, a signal to initiate the testing, the testing circuit connected, via a bus, to a processor and the at least one RAM circuit, the at least one RAM circuit including at least a first memory block of the memory blocks;
    determining, by the testing circuit, that the bus is not reserved;
    reserving, by the testing circuit, the bus, the reserving including:
        transmitting, by the testing circuit, a reservation signal to a bus arbiter circuit, and
        receiving, by the testing circuit, an acknowledgement signal;
    reading, by the testing circuit, first application data from the first memory block to the testing circuit via the bus;
    storing, by the testing circuit, the first application data to a memory associated with the testing circuit;
    writing, by the testing circuit, at least one first data pattern to the first memory block via the bus;
    reading, by the testing circuit, at least one second data pattern from the first memory block via the bus;
    verifying, by the testing circuit, functionality of the at least one RAM circuit based on the at least one first data pattern and the at least one second data pattern;
    writing, by the testing circuit, the first application data from the memory associated with the testing circuit to the first memory block via the bus, if the verifying indicates the functionality of the first memory block of the at least one RAM; and
    releasing, by the testing circuit, the bus for use by the processor prior to testing a second memory block of the memory blocks of the at least one RAM circuit.

2. The method according to claim 1, further comprising:
    reserving the bus for the testing circuit if the allocation of the bus is not necessary for other purposes than memory testing; and
    conducting, by the testing circuit, the testing of the second memory block.

3. The method according to claim 1, further comprising:
    storing to at least one first register in the testing circuit information associated with at least one memory block for which memory testing is to be performed.

4. The method according to claim 3, wherein the information is an address range of the at least one memory block.

5. The method according to claim 3, further comprising:
    detecting a booting signal by the processor; and
    storing to the at least one first register in the testing circuit information that the at least one random access memory circuit are to be tested completely.

6. The method according to claim 1, further comprising: storing to at least one second register in the testing circuit information indicating a schedule for signaling the initiation of the testing of the at least one random access memory circuit.

7. The method according to claim 1, further comprising: storing a memory testing algorithm to a program memory in association with the testing circuit.

8. The method according to claim 1, wherein the reserving the bus comprises:
adding information about the reservation signal and a bus address of the testing circuit to a queue of the bus arbiter circuit.

9. The method according to claim 1, wherein the first memory block comprises all aggressor memory cells and all victim memory cell, the aggressor memory cells configured to change states of the victim memory cells.

10. The method according to claim 1, wherein the first memory block comprises all addresses within a sub-unit of an address decoder of the first random access memory circuit among the at least one random access memory circuit.

11. The method according to claim 1, wherein the at least one first data pattern comprises at least one of a checkerboard data pattern, a march test data pattern and a galloping pattern for galloping pattern test.

12. The method according to claim 1, wherein the processor, the testing circuit, the bus and the at least one memory circuit are associated with a chipset.

13. The method according to claim 1, wherein the processor, the testing circuit and the bus are associated with a single chip.

14. The method according to claim 1, wherein the processor, the testing circuit, the bus and the at least one memory circuit are associated with an elevator safety unit.

15. The method according to claims 14, wherein the elevator safety unit controls at least one of an acceleration limit of an elevator cage, an elevator scale, an emergency break of the elevator, at least one elevator door and a distress signal communication link.

16. A testing circuit configured to test a functionality of memory blocks of at least one random access memory (RAM) circuit connected thereto via a bus, comprising:
a temporary memory; and
a processor configured to:
receive a signal to initiate testing of the at least one (RAM) circuit,
reserve the bus for the testing circuit, if the bus is not reserved, the processor being configured to reserve the bus by transmitting a reservation signal to a bus arbiter circuit, and receiving an acknowledgement signal,
read first application data from a first memory block of the memory blocks of the at least one RAM circuit via the bus,
store the first application data to the temporary memory,
write at least one first data pattern to the first memory block via the bus,
read at least one second data pattern from the first memory block via the bus,
verify the functionality of the at least one RAM circuit based on the at least one first data pattern and the at least one second data pattern,
write the first application data to the first memory block via the bus, if the processor verifies the functionality of the first memory block of the at least one RAM circuit, and
release, by the testing circuit, the bus for use by the processor prior to testing a second memory block of the memory blocks of the at least one RAM circuit.

17. A non-transitory computer readable medium storing a computer program comprising code that, when executed by a processor of a testing circuit, configures the processor of the testing circuit to test a functionality of memory blocks of at least one random access memory (RAM) circuit by,
receiving, by the testing circuit, a signal to initiate the testing, the testing circuit connected, via a bus, to a processor and the at least one RAM circuit, the at least one RAM circuit including at least a first memory block of the memory blocks;
determining, by the testing circuit, that the bus is not reserved;
reserving, by the testing circuit, the bus, the reserving including:
transmitting, by the testing circuit, a reservation signal to a bus arbiter circuit, and
receiving, by the testing circuit, an acknowledgement signal;
reading, by the testing circuit, first application data from the first memory block to the testing circuit via the bus;
storing, by the testing circuit, the first application data to a memory associated with the testing circuit;
writing, by the testing circuit, at least one first data pattern to the first memory block via the bus;
reading, by the testing circuit, at least one second data pattern from the first memory block via the bus;
verifying, by the testing circuit, functionality of the at least one RAM circuit based on the at least one first data pattern and the at least one second data pattern;
writing, by the testing circuit, the first application data from the memory associated with the testing circuit to the first memory block via the bus, if the verifying indicates the functionality of the first memory block of the at least one RAM circuit; and
releasing, by the testing circuit, the bus for use by the processor prior to testing a second memory block of the memory blocks of the at least one RAM circuit.

* * * * *